United States Patent [19]

Saitoh et al.

[11] Patent Number: 4,491,976
[45] Date of Patent: Jan. 1, 1985

[54] WIDE-BAND TUNER HAVING A TEMPERATURE-COMPENSATED MICROSTRIP RESONATOR ARRANGEMENT

[75] Inventors: Takeshi Saitoh, Yokohama; Shigeo Matsuura, Chigasaki; Minoru Moteki; Hiroshi Hatashita, both of Yokohama, all of Japan

[73] Assignee: Hitachi, Ltd., Tokyo, Japan

[21] Appl. No.: 436,357

[22] Filed: Oct. 25, 1982

[30] Foreign Application Priority Data

Oct. 26, 1981 [JP] Japan .................. 56-170013

[51] Int. Cl.³ .............................................. H04B 1/26
[52] U.S. Cl. ...................... 455/315; 455/189;
455/183; 455/316; 455/325
[58] Field of Search .......... 455/189, 314, 315, 318,
455/325, 327, 328, 316, 183; 333/229, 234

[56] References Cited
U.S. PATENT DOCUMENTS

| | | | |
|---|---|---|---|
| 4,152,669 | 5/1979 | Igarashi | 455/316 |
| 4,214,212 | 7/1980 | Dipietromaria | 455/315 |
| 4,340,975 | 7/1982 | Onishi et al. | 455/315 |
| 4,352,209 | 9/1982 | Ma | 455/189 |

OTHER PUBLICATIONS

"An MDS Down Converter of Thick-Film Mic for 2 GHz Pay TV", by Uwamo et al., 8/1981.

Primary Examiner—Jin F. Ng
Attorney, Agent, or Firm—Antonelli, Terry & Wands

[57] ABSTRACT

A double-superheterodyne tuner for a television receiver comprises a tunable oscillator, a fixed oscillator, two mixer stages and a band-pass filter between the mixer stages, and operates at a GHz intermediate frequency between the mixer stages. The two oscillators and the bandpass filter each includes a microstrip line resonator formed in a dielectric body having substantially the same dielectric constant and dielectric constant temperature coefficient to each other, thereby compensating the variation of the resonant frequency in the resonator due to an ambient temperature variation.

38 Claims, 18 Drawing Figures

FIG. 3A MICROSTRIP RESONATOR

WIDE-BAND TUNER HAVING A TEMPERATURE-COMPENSATED MICROSTRIP RESONATOR ARRANGEMENT

BACKGROUND OF THE INVENTION

1. Field of the Invention

The present invention relates to a wide-band tuner of a television receiver, and more particularly to a wide-band tuner having a temperature-compensated microstrip resonator arrangement.

2. Description of the Prior Art

FIG. 1 shows a block diagram of a tuner of a television receiver which converts a received frequency to an intermediate frequency by a well-known double-superheterodyne system.

The tuner comprises an RF signal input terminal 1, a band-pass filter 2, a variable attenuator 3 for controlling a gain by an AGC signal, an RF wide-band amplifier 4, a first mixer 5, a first local oscillator 6, a narrow-band band-pass filter 7, a first intermediate frequency amplifier 8, a second mixer 9, a second local oscillator 10, a second intermediate frequency amplifier 11 and an intermediate signal output terminal 12.

The received RF signal $f_{RF}$ of 50–900 MHz applied to the RF signal input terminal 1 is selected by the band-pass filter 2 which also suppresses a harmonic signal interference and an intermodulation interference, and the selected RF signal is attenuated by the variable attenuator 3 by the AGC signal which is proportional to the magnitude of the RF signal, and it is then amplified by the RF wide-band amplifier 4 and then it is supplied to the first mixer 5. The first mixer 5 converts a desired RF signal of the input RF signal to a first intermediate frequency signal $f_{IF1}$ by an oscillation signal $f_{OSC1}$ of the first local oscillator 6. For example, when $f_{RF}=500$ MHz, the signal $f_{OSC1}$ of 2500 MHz is oscillated so that the signal $f_{IF1}$ of 3000 MHz is produced. The signal of 3000 MHz of the signal converted by the first mixer 5 is selected by the narrow-band band-pass filter 7 and a signal which disturbs an image and harmonic components of the signal $f_{OSC1}$ are attenuated by the filter 7, and the output of the filter 7 is amplified by the first intermediate frequency amplifier 8, and the output of the amplifier 8 is supplied to the second mixer 9. The second mixer 9 converts the first intermediate frequency signal from an oscillation signal $f_{OSC2}$ of the second local oscillator 10 to a second intermediate frequency signal, that is, a normal intermediate frequency signal $f_{IF}$. When the intermediate frequency signal $f_{IF}$ is 57 MHz, the oscillation signal $f_{OSC2}$ is 3057 MHz. The intermediate frequency signal $f_{IF}$ thus derived is selectively amplified by the intermediate frequency amplifier 11 and an output thereof is taken out from the intermediate frequency signal output terminal 12.

A UHF/VHF band tuner which has an intermediate frequency in a 3 GHz band and uses a YIG filter is disclosed in the U.S. Pat. No. 3,939,429 issued on Feb. 17, 1976. The YIG filter is difficult to manufacture, expensive and locks practicability.

A variation of frequency of the circuit due to a temperature change is now discussed. The frequency $f_{IF}$ of the intermediate frequency signal is expressed by a formula: (1):

$$f_{IF}=f_{OSC2}-(f_{RF}+f_{OSC1}) \qquad (1)$$

From the formula (1), a variation $\Delta f_{IF}$ of the frequency $f_{IF}$ when a surrounding temperature T changes by $\Delta T$ is expressed by a formula (2);

$$\Delta f_{IF}=\Delta f_{OSC2}-\Delta f_{OSC1} \qquad (2)$$

where $\Delta f_{OSC2}$ and $\Delta f_{OSC1}$ are variations of $f_{OSC2}$ and $f_{OSC1}$, respectively. From the formula (2), if the variations of $f_{OSC2}$ and $f_{OSC1}$ are equal, the variation of the intermediate frequency $f_{IF}$ can be made sufficiently small even if the variations of $f_{OSC2}$ and $f_{OSC1}$ are large. Since $\Delta f_{OSC2}$ and $\Delta f_{OSC1}$ depend on the magnitudes of $f_{OSC2}$ and $f_{OSC1}$, respectively, the magnitudes of $f_{OSC2}$ and $f_{OSC1}$ must be of substantially the same order.

The output level of the intermediate frequency signal is determined by a frequency relation of the narrow-band band-pass filter 7 and the second local oscillator 10. In order to extract the intermediate frequency signal at an optimum condition, it is essential that the absolute values of the frequency variations of the band-pass filter 7 and the second local oscillator 10 are equal. The formula (1) can be expressed by a center frequency $f_{IF1}$ of the pass band of the narrow-band band-pass filter 7 as shown by a formula (3) and a variation of the formula (3) to the temperature change is expressed by a formula (4). Thus, if a frequency variation $\Delta f_{IF1}$ of the pass band of the narrow-band band-pass filter 7 and the frequency variation $\Delta f_{OSC2}$ of the second local oscillation frequency are equal and $f_{IF1}$ and $f_{OSC2}$ are of substantially the same order, the variation of the output level of the intermediate frequency signal can be made sufficiently small.

$$f_{IF}=f_{OSC2}-f_{IF1} \qquad (3)$$

$$\Delta f_{IF}=\Delta f_{OSC2}-\Delta f_{IF1} \qquad (4)$$

From the above, if the frequency variations of the first local oscillator 6, the narrow-band band-pass filter 7 and the second local oscillator 10 to the temperature change are equal, the variation of the intermediate frequency and the variation of the output level of the intermediate frequency signal can be made sufficiently small even if the above frequency variations are large.

The first intermediate frequency $f_{IF1}$ is usually set to be two times, and preferably four times as high as the highest frequency $f_{RF\ max}$ of a reception RF signal which can be received by the tuner in order to avoid the interference which would otherwise occur in the first mixer 5. Accordingly, the frequency $f_{IF1}$ is set to a frequency in the 3 GHz band, as described above. In this case, $f_{OSC1}$ is 2100–2950 MHz, $f_{OSC2}$ is 3057 MHz and a resonator is preferably constructed by a microwave integrated circuit (MIC) which uses a microstrip line. The circuit can be miniaturized by utilizing a high dielectric constant substrate such as an alumina-ceramic substrate. Accordingly, the circuit can be constructed by the microstrip line without using capacitors and coils which were required in the prior art tuner, and hence mass-productivity is improved.

As a resonator which uses the microstrip line, for the first local oscillator, the narrow-band band-pass filter or the second local oscillator, a grounded end shortened resonator shown in FIG. 2 is disclosed in a Japanese article by Ogawa et al entitled "All-Band Microtuner for Pocketable Liquid Crystal TV Receiver" in the technical report by the Institute of Television Engineers of Japan, TEB 68-3, IPD 54-3, Jan. 29, 1981. In the shortened microstrip resonator a capacitor is connected with one or both ends of the microstrip and the length of the microstrip is shorter than that corresponding to the actual resonant wavelength, but the microstrip resonator can be resonant at a frequency corresponding to the actual resonant wavelength. In an oscillator which uses such a resonator, an overall resonant frequency $f_o$ is determined by the grounded end shortened microstrip resonator 15 (having a characteristic impedance $Z_1$ and a length $l_1$) and a shortening capacitor ($C_1$) 14, a capacitor ($C_2$) 13 represents a reactance element such as a transistor or other active device. The resonant frequency $f_o$ can be expressed by $$2\pi f_o \approx \sqrt{\frac{(C_1 + C_2) C_o}{C_1 \cdot C_2 \cdot Z \cdot l_1}} \quad (5)$$

where $C_o$ is a light velocity, $Z = \sqrt{\epsilon} \cdot Z_1$, and $\epsilon$ is an effective dielectric constant which is given by a formula (6) from the following formula:

$$Z_1 = \frac{120}{\frac{w}{h} + 2.42 - 0.44\frac{h}{w} + \left(1 - \frac{h}{w}\right)^6} \quad (\Omega), \frac{w}{h} \geq 1 \quad (6)$$

$$\epsilon = \frac{\epsilon\gamma + 1}{2} + \frac{\epsilon\gamma - 1}{2} \cdot \left(1 + \frac{h}{w}\right)^{-\frac{1}{2}}$$

where $\epsilon\gamma$ is a specific dielectric constant, h is a thickness of the substrate and w is a width of the microstrip line. From the formula (6), if the variations of w and h by the temperature change are equal, a variation of Z by the temperature change is essentially determined by a temperature coefficient of $\epsilon\gamma$. In the formula (5), it is assumed that $l_1$ is shorter than one-fourth ($\frac{1}{4}$) of a wavelength.

From the formula (5) it is seen that the variation of the resonance frequency $f_o$ by the temperature change is governed by the variations of the capacitors $C_1$ and $C_2$ by the temperature change if the variation of the substrate dimension such as Z or $l_1$ by the temperature change is sufficiently small. Accordingly, in order to reduce the variation of $f_{IF}$ by the temperature change, it is necessary to optimize the temperature coefficients of the capacitors corresponding to $C_1$ and $C_2$ used in the first local oscillator, the narrow-band band-pass filter and the second local oscillator. Since the frequency band is in 2-3 GHz band, it is practically difficult to attain such a circuit configuration.

SUMMARY OF THE INVENTION

It is an object of the present invention to provide a double-superheterodyne tuner circuit arrangement having a good temperature characteristic.

In accordance with the present invention, an arrangement of a resonator is approached to that of a microstrip line without using the shortened microstrip line described above so that a temperature coefficient of a dielectric constant of a substrate is governing, and the microstrip line resonators of a band-pass filter which selectively passes at least the first intermediate frequency and of a second local oscillator are arranged on dielectric substrates having substantially the same dielectric constant and dielectric constant temperature coefficient in order to improve the temperature characteristic of the double-superheterodyne tuner.

In accordance with another feature of the present invention, the microstrip line resonator of the first local oscillator is arranged on the dielectric substrate described above.

BRIEF DESCRIPTION OF THE DRAWINGS

FIGS. 3A to 3C a pattern diagram, an equivalent circuit and a filter attenuation characteristic curve, respectively, of a microstrip line which is an embodiment of a narrow-band band-pass filter.

DESCRIPTION OF THE PREFERRED EMBODIMENTS

Figure 3B:
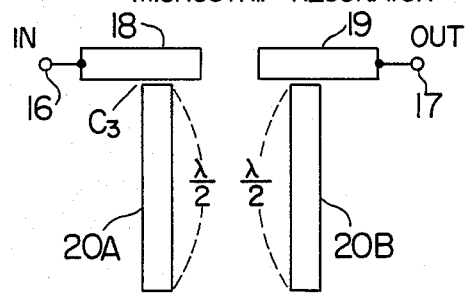
Figure 3B:
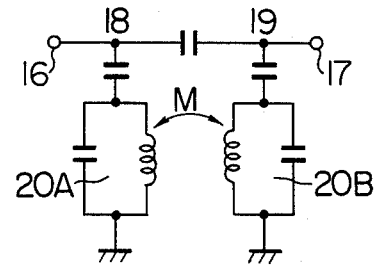
Figure 3C:
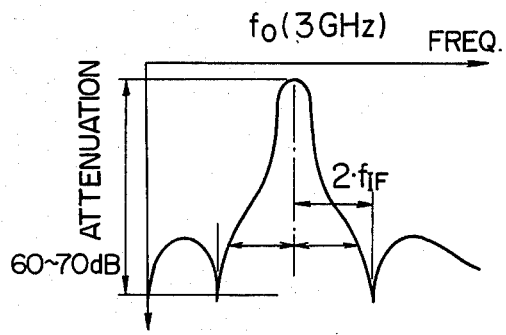

Referring to FIGS. 3A-3C, a microstrip narrow-band band-pass filter used in one embodiment of the present invention is explained. FIG. 3A shows a line configuration in a pattern plane of the microstrip line arrangement. FIGS. 3B and 3C shows an equivalent circuit and an attenuation characteristic, respectively, of the band-pass filter of FIG. 3A. Numeral 16 denotes a first intermediate frequency signal input terminal, numeral 17 denotes an output terminal, numeral 18 denotes an input line, numeral 19 denotes an output line and numerals 20A and 20B denote one-half wavelength resonators. The narrow-band band-pass filter exhibits a narrow-band band-pass filter characteristic which passes a first intermediate frequency band in a 3 dB band width of 18-20 MHz by resonance of the one-half wavelength resonators 20A and 20B and mutual inductive coupling of the one-half wavelength resonators 20A and 20B, and forms a trap having an attenuation of 60–70 dB on both upper side and lower side of the pass band as shown in FIG. 3C by capacitive coupling at open ends of the input line 18 and the output line 19 and the mutual inductance M. This trap serves to suppress an image disturbance which would otherwise occur in a second mixer. The band-pass filter of this type is disclosed in the U.S. patent application Ser. No. 186738 entitled "Band-pass Filter" filed on Sept. 12, 1980 and assigned to the present assignee.

Figure 4:
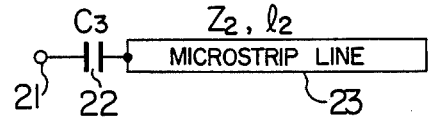
FIG. 4 shows an equivalent circuit of a resonator which uses a microstrip line of one-half wavelength.

An equivalent circuit of one of the resonators of the band-pass filter is shown in FIG. 4. Numeral 21 denotes a terminal which is connected to the input terminal 16 (or output terminal 17) of FIG. 3 or the input line 18 (or output line 19), numeral 22 denotes a coupling capacitor $C_3$ between the one-half wavelength microstrip resonator 20A and the input line 18 (or between the resonator 20B and the output line 19), and numeral 23 denotes a one-half wavelength microstrip resonator (having a charactersitic impedance $Z_2$ and a length $l_2$) which is open ended.

A resonance frequency $f_o$ of the equivalent circuit is approximated by $$2\pi f_o \approx \frac{\pi \cdot C_o}{\sqrt{\epsilon} \cdot l_2} \quad (7)$$

where $C_o$ is a light velocity, $\epsilon$ is an effective dielectric constant and $l_2$ is the length of the one-half wavelength microstrip 20A or 20B.

From the formula (7), a variation of a center frequency $f_{IF1}$ of a pass band of the narrow-band band-pass filter by a temperature change is governed by a temperature coefficient of the effective dielectric constant $\epsilon$ assuming that the variation due to the length $l_2$ is sufficiently small. When a substrate is made of alumina-ceramic and conductive paste primarily consisting of copper is printed through a mask and fired or printed, fired and etched to form the microstrip line, the variation of the conductor of the length $l_2$ by the temperature change is determined by a line expansion coefficient of the alumina-ceramic because the bonding between the alumina-ceramic substrate and the copper conductor is strong and hence there is no slip between the substrate and the conductor due to a difference between the thermal expansion coefficients. In addition, the line expansion coefficient of the conductor is +7–+8 ppm/°C. which is smaller than the dielectric constant temperature coefficient of the alumina-ceramic substrate of +100 ppm/°C. That is, $$\frac{1}{l_2} \frac{dl_2}{dT} << \frac{1}{\epsilon} \frac{d\epsilon}{dT}.$$

Accordingly, it is seen that the temperature coefficient of the effective dielectric constant is governing.

Figure 5:
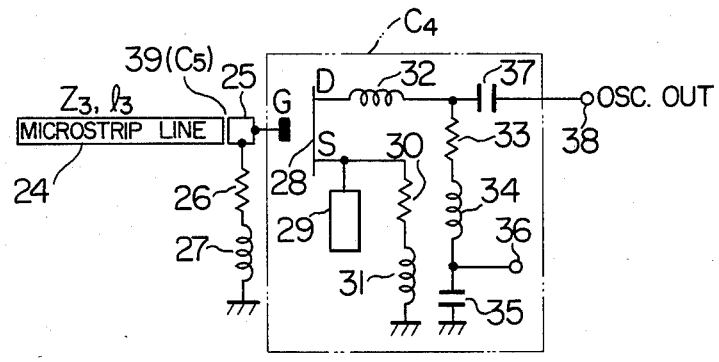
FIG. 5 shows a circuit diagram of a second local oscillator.
Figure 6:
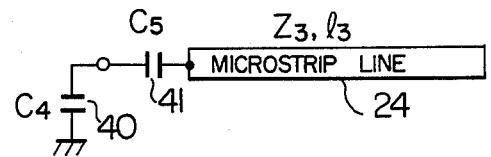
FIG. 6 shows an equivalent circuit of a resonance circuit of the second local oscillator shown in FIG. 5.

FIG. 5 shows a circuit diagram of a second local oscillator which uses a one-half wavelength microstrip resonator and FIG. 6 shows an equivalent circuit thereof.

In FIG. 5, numeral 24 denotes a one-half wavelength microstrip resonator, numeral 25 denotes a conductor pattern to which gate (G) of a GaAs metal semiconductor (MES) FET is attached by soldering, numeral 26 denotes a damping resistor, numeral 27 denotes a choke coil constructed by a one-fourth wavelength microstrip line, numeral 28 denotes the GaAs MES FET, numeral 29 denotes a microstrip line which imparts an impedance to maintain the FET in a negative resistance state, numeral 30 denotes a source (s) resistor which self-biases the FET, numeral 31 denotes a choke coil constructed by a microstrip line having the same characteristic as the choke coil 27, numeral 32 denotes an inductor which is a portion of a load impedance of the FET, numeral 33 denotes a protecting resistor, numeral 34 denotes a choke coil having the same construction and the same function as the choke coils 27 and 31, numeral 35 denotes a D.C. blocking capacitor, numeral 36 denotes a voltage supply terminal, numeral 37 denotes a capacitor which is a portion of the load impedance of the FET, numeral 38 denotes an oscillation output terminal and numeral 39 denotes a gap.

In this oscillation circuit, an open ended microstrip line having a predetermined impedance is connected to a source of the FET 28, and an impedance looked from a gate of the FET exhibits a negative resistance with a load of 50 Ω being connected to the terminal 38 through the inductor 32 and the capacitor 37 so that the oscillation occurs at a predetermined oscillation frequency by the reactance of the FET looked from the gate of the FET and the capacitance of the one-half wavelength microstrip resonator 24 and the gap 39. A Q of the load is high due to the coupling by the gap 39. The oscillation frequency is substantially equal to the resonance frequency of the one-half wavelength microstrip resonator 24.

In FIG. 6 which shows the equivalent circuit of the oscillation circuit of FIG. 5, the one-half wavelength microstrip resonator 42 is represented by a characteristic impedance $Z_3$ and a length $l_3$, the capacitance of the gap is represented by a capacitor $C_5$ 41 and the FET reactance is represented by a capacitor $C_4$ 40. The oscillation frequency $f_o$ of the circuit is approximated by:

$$2\pi f_o \approx \sqrt{3 \cdot \left( \frac{C_o^2}{\epsilon l_3^2} + \frac{C_4 \cdot C_5}{C_4 + C_5} \cdot \frac{Z_3 \cdot C_o^3}{\epsilon^2 l_3^3} \right)} \quad (8)$$

where $C_o$ is the light velocity and $\epsilon$ is the effective dielectric constant.

Assuming that $C_4$ and $C_5$ are small, the formula (8) is approximated by $$2\pi f_o \approx \frac{\sqrt{3} \cdot C_o}{\sqrt{\epsilon} \cdot l_3} \quad (9)$$

In the formula (9), assuming that the variation of $l_3$ by the temperature change is small, the variation of the oscillation frequency $f_o$ by the temperature change is governed by the temperature coefficient of the effective dielectric constant $\epsilon$.

As described above, when the narrow-band band-pass filter and the second local oscillator are constructed by the one-half wavelength microstrip resonators, the variation of the center frequency $f_{IF1}$ of the pass band of the narrow-band band-pass filter and the variation of the second local oscillation frequency $f_{OSC2}$ by the temperature change are governed by the temperature coefficient of the dielectric constant of the dielectric body used as the substrate. When the narrow-band band-pass filter and the second local oscillator are constructed on the dielectric substrates having the substantially equal dielectric constant and the substantially equal temperature coefficient of dielectric constant such that the line expansion of the microstrip line conductors is prevented, that is, the microstrip line conductors are arranged on the alumina-ceramic substrates by thick film printing techniques, it is possible to approach the line expansion of the conductors (e.g. +20 ppm/°C. for copper to the line expansion of the alumina-ceramic (7-8 ppm/°C.)) and make it sufficiently small, and hence it is possible to provide a tuner having a sufficiently small level variation of the intermediate frequency signal output $f_{IF}$.

When the alumina-ceramic is metallized by the thick film technology, the bonding between the metallized conductor and the alumina-ceramic may be (a) oxygen atom interleaved bonding (oxygen bonding) of the alumina-ceramic and the conductor, (b) glass bonding of the alumina-ceramic and the conductor by glass constituent in a conductive paste or (c) combination bonding of (a) and (b). In any case, it is considered that a slip between the alumina-ceramic and the conductor due to a difference of thermal expansion coefficient at the interface of the alumina-ceramic and the conductor is not included.

Figure 7:
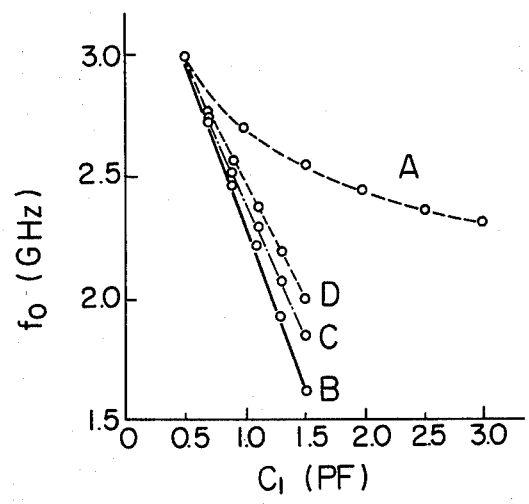
FIG. 7 shows a characteristic diagram illustrating a relation between a change of capacitance of a varactor diode and a change of oscillation frequency derived by calculation in the resonance circuit of the first local oscillator which uses the equivalent circuit of FIG. 2 and the equivalent circuit of FIG. 8.
Figure 8:
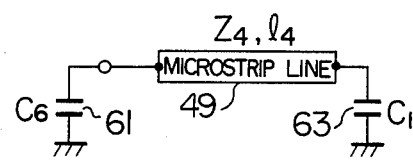
FIG. 8 shows an equivalent circuit of the resonance circuit of the first local oscillator in which one end of a one-fourth wavelength microstrip line is grounded by a capacitor corresponding to a varactor diode.
Figure 9:
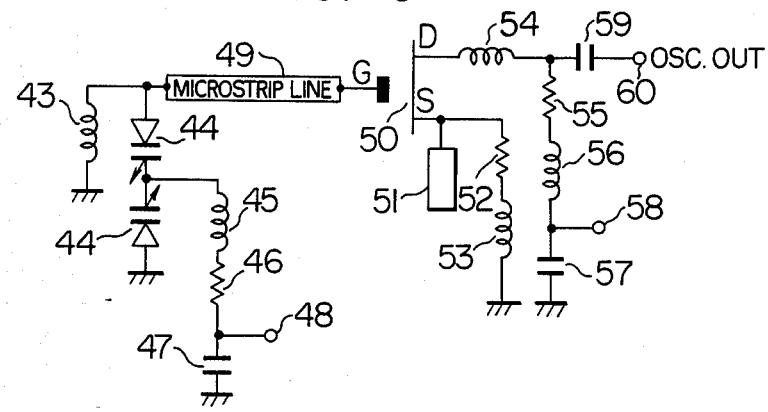
FIG. 9 shows a circuit diagram of the first local oscillator which uses the resonance circuit of FIG. 8.

A frequency-temperature characteristic of the intermediate frequency signal output $f_{IF}$ is now discussed. As described above, by constructing the resonators of the narrow-band band-pass filter and the second local oscillator by the one-half wavelength microstrip resonators arranged on the substrates having the substantially equal dielectric constant and the substantially equal temperature coefficient of the dielectric constant, the temperature coefficients of both frequencies are substantially equal. Accordingly, in order to get an excellent temperature characteristic of the intermediate frequency signal output $f_{IF}$, the capacitors of only the first local oscillator corresponding to the capacitors $C_1$ and $C_2$ of the grounded end shortened microstrip resonator as shown in the equivalent circuit of FIG. 2 need be optimized. Accordingly, the circuit design is facilitated. However, it is necessary to vary the oscillation frequency of the first local oscillator is accordance with the frequency of the desired reception RF signal and hence it is necessary to constructed the capacitor corresponding to $C_1$ in FIG. 2 by a variable capacitance device such as a varactor diode. It is necessary to select a varactor diode having a self-resonance frequency beyond the oscillation frequency band, for example, one having a small capacitance. In the equivalent circuit of FIG. 2, when $C_2$ is 2 pF and the capacitance $C_1$ of the varactor diode is 0.5-3 pF, the length $l_1$ of the microstrip line is determined such that the oscillation frequency is 3 GHz when $C_1$ is 0.5 pF, and the change of the oscillation frequency when $C_1$ is changed to 3 pF is calculated resulting in a broken line curve A shown in FIG. 7, in which an abscissa represents the capacitance $C_1$ of the varactor diode and an ordinate represents the oscillation frequency $f_o$. The oscillation frequency is 2.3 GHz when $C_1$ is maximum, and it cannot be changed to the desired 2 GHz. It is possible to increase the range of the frequency change by reducing the capacitance $C_2$ but it is not possible to obtain the desired range of the frequency change because an active device and a capacitor having a predetermined temperature coefficient for temperature compensation must be externally added to the capacitor $C_2$. Thus, the change of the resonance frequency in a resonance circuit shown in FIG. 8 is calculated. In FIG. 8, numeral 61 denotes a capacitor $C_6$ corresponding to the active device, numeral 49 denotes a one-fourth wavelength microstrip resonator (having a characteristic impedance $Z_4$ and a length $l_4$) and numeral 63 denotes a capacitor $C_1$ corresponding to the capacitance of the varactor diode. a calculation result of the change of the resonance frequency $f_o$ when $C_6$ is 2 pF and $C_1$ is 0.5 pF–1.5 pF is shown by a solid line curve B in FIG. 7. The length $l_4$ is determined such that the resonance frequency is 3 GHz when $C_1$ is 0.5 pF, and $f_o$ is changed to 1.6 GHz when $C_1$ is changed to 1.5 pF so that the change of 2–3 GHz required for the change of the oscillation frequency of the first local oscillator is obtained. Calculation results when a temperature compensation capacitor and a stray capacity in a package are considered are shown by curves C and D in FIG. 7. The curve C shows the change of frequency when 1 pF is added to the capacitor $C_6$ of FIG. 8 and 0.5 pF is added to the capacitor $C_1$. In this case, the desired range of change is obtained. The curve D shows the change of frequency when 2 pF is added to $C_6$. In this case, again, the desired range of change is obtained. Thus, when the first local oscillator is constructed as shown in FIG. 8, the first local oscillator can provide the desired range of change of the oscillation frequency with the temperature compensation being imparted by the compensation capacitor having a temperature characteristic matched to those of the narrow-band band-pass filter and the second local oscillator. By constructing the first local oscillator by the resonance circuit of FIG. 8, an oscillator shown in FIG. 9 is provided. Numeral 42 denotes a choke coil constructed by a one-fourth wavelength microstrip line, numeral 44 denotes a varactor diode, numeral 45 denotes a choke coil constructed by a microstrip line, numeral 46 denotes a resistor, numeral 47 denotes a D.C. blocking capacitor, numeral 48 denotes a voltage terminal to apply an voltage to the varactor diode 44, numeral 49 denotes a one-fourth wavelength microstrip line, numeral 50 denotes a GaAs MES FET, numeral 51 denotes an open ended microstrip line for imparting an impedance to a source of the FET, numeral 52 denotes a resistor for left-biasing the FET, numeral 53 denotes a choke coil constructed by a one-fourth wavelength microstrip line, numeral 54 denotes an inductor, numeral 55 denotes a protecting resistor, numeral 56 denotes a choke coil constructed by a one-fourth wavelength microstrip line, numeral 57 denotes a D.C. blocking capacitor, numeral 58 denotes a voltage supply terminal, numeral 59 denotes a capacitor and numeral 60 denotes an oscillation output terminal. A principle of oscillation of the oscillator of FIG. 9 is the same as that of the second local oscillator shown in FIG. 5. The series-connected vacactor diodes 44 and the microstrip resonator 49 are connected to the gate of the FET. By the series connection of the varactor diodes 44, the oscillated power is rectified by the varactor diodes 44 so that the rectified voltages appearing across the varactor diodes 44 are cancelled. Thus, when the voltage supplied from the voltage terminal 48 is low, the voltage actually applied to the varactor diodes 44 is made to be substantially equal to the supply voltage. In this manner, the narrowing of the range of frequency change is prevented.

As described above, by constructing the first local oscillator as shown in FIG. 9, the temperature compensation which matches with the frequency-temperature characteristics of the narrow-band band-pass filter and the second local oscillator can be effected by the externally added temperature compensating capacitor and a sufficient range of change of the oscillation frequency can be obtained. Accordingly, the stability of the frequency and the level of the intermediate frequency signal for the temperature change is readily attained.

For the first local oscillator, the resonance frequency $f_o$ is approximated as follows in the equivalent circuit shown in FIG. 8.

$$2\pi f_o \approx \frac{\pi + \sqrt{\pi^2 + 16\left(\frac{\epsilon \cdot l_4}{C_1 \cdot Z \cdot C_o} + \frac{C_6}{C_1}\right)}}{4\left(\frac{\sqrt{\epsilon} \cdot l_4}{C_o} + \frac{C_6 \cdot Z}{\sqrt{\epsilon}}\right)} \quad (10)$$

where $C_o$ is the light velocity, $\epsilon$ is the effective dielectric constant and $Z=\sqrt{\epsilon}\cdot Z_4$.

Figure 2:
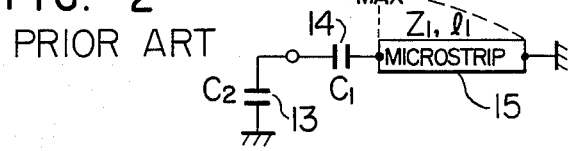
FIG. 2 shows an equivalent circuit of a resonance circuit which uses a grounded-end shortened microstrop resonator.

In the formula (10), the effective dielectric constant contributes to compare with the shortened microstrip resonator of the equivalent circuit shown in FIG. 2. By increasing one of the variations of $C_1$ and $C_6$ by the temperature change which is closer to the variation of the effective dielectric constant by the temperature change, that is, the capacitance resulting from the dielectric substrate, of the capacitances $C_1$ and $C_6$, the variation of the resonance frequency $f_o$ by the temperature change can be governed by the temperature coefficient of the dielectric constant so that the temperature characteristic close to those of the narrow-band band-pass filter and the second local oscillator can be attained without externally adding the temperature compensating capacitor. The capacitance to be added to $C_1$ or $C_6$ can be formed on the substrate having the substantially equal dielectric constant and the substantially equal dielectric constant temperature coefficient as those of the dielectric substrates of the narrow band band-pass filter and the second local oscillator or on the alumina-ceramic substrate by wet multi-layer thick film techniques, or a stray capacity may be utilized.

In the first local oscillator shown in FIG. 9, the externally added capacitor is not specifically shown. When this circuit is constructed by a wet multi-layer ceramic substrate, a stray capacitance is necessarily included between the varactor diodes 44 or the mounting pattern of the FET 50 and ground so that the ratio of the capacitance having the same temperature coefficient as the substrate dielectric constant to the capacitance $C_1$ or $C_6$ is large. As a result, the temperature characteristic of the oscillation frequency of the first local oscillator approaches to the frequency-temperature characteristics of the narrow-band band-pass filter and the second local oscillator and hence an excellent temperature characteristic of the intermediate frequency signal is attained.

Figure 13A:
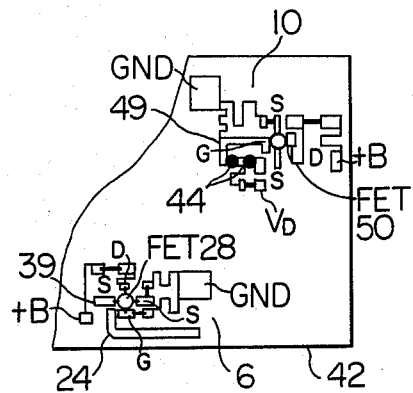
FIGS. 13A to 13C show a top plan view, a side view and a bottom view, respectively, of one embodiment of the tuner of the present invention.
Figure 13B:
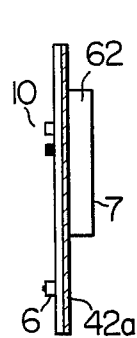
Figure 13C:
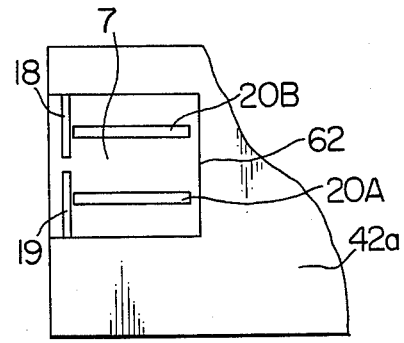

The first local oscillator and the second local oscillator shown in FIGS. 9 and 5, respectively, are constructed as shown in FIGS. 13A–13C by alternately printing a conductive paste primarily consisting of tungsten and a dielectric paste primarily consisting of alumina on front and back surfaces of an unfired alumina-ceramic substrate having the same dielectric constant and the same composition as the alumina dielectric paste, and firing them to form a dielectric substrate 42, printing a conductive paste primarily consisting of copper on the front and back surface of the substrate, firing them and forming microstrip lines by etching to form a circuit package, and forming a filter having the same circuit as the narrow-band band-pass filter shown in FIG. 3 on an alumina-ceramic substrate 62 which is different from the above dielectric substrate and has substantially the same dielectric constant and substantially the same dielectric constant temperature coefficient as those of the above dielectric substrate by a conductive paste primarily consisting of copper by the thick film printing technology such that it is mounted on ground conductors 42a on the front and back surfaces of the substrate to form a double-superheterodyne tuner.

In the embodiment shown in FIGS. 13A–13C, a Q of higher than 600 under no load condition is required in order to assure the characteristic of the narrow-band band-pass filter 7 to this end, in order to reduce a conductor loss, a dielectric body loss and a radiation loss of the substrate which includes the microstrip resonator, the thick film conductor is made of copper and the alumina substrate has a high purity of 99.7% and the substrate has a thickness of 1.5 mm. The temperature characteristic of the intermediate frequency signal, the temperature characteristics of the oscillation frequencies of the first and second local oscillators and the temperature characteristic of the band-pass filter measured for the tuner thus constructed are now discussed. The tuner has the circuit configuration as shown in the block diagram of FIG. 1, and the input band-pass filter 2, the variable attenuator 3, the RF wide-band amplifier 4, the first mixer 5, the first local oscillator 6, the first intermediate frequency amplifier 8, the second mixer 9, the second local oscillator 10 and the second intermediate frequency mixer 11 are constructed on the same substrate by the wet multi-layer thick film techniques and the copper thick film techniques, and the narrow-band band-pass filter 7 is constructed on another substrate by the copper thick film techniques. A specific dielectric constant of the substrate formed by the wet thick film technology is approximately 8.5, a temperature coefficient thereof is approximately +100 ppm/°C. and a line expansion coefficient is approximately +8 ppm/°C., and a dielectric constant of the narrow-band band-pass filter substrate is approximately 9.5, a temperature coefficient thereof is approximately +100 ppm/°C. and a line expansion coefficient thereof is approximately +8 ppm/°C. Resistors of the circuits are formed by the thick film printing technology and small capacitance capacitors other than large capacitance capacitors are formed by utilizing the wet multi-layer thick film substrate, and the same type of GaAs MES FET's are used as the active devices of the first and second local oscillators in order to eliminate a difference between factors which contribute to the temperature characteristics of the first and second local oscillators and stabilize the operation by low power consumption. The length $l_3$ of the microstrip resonator of the first local oscillator is approximately 10 mm, the length $l_4$ of the microstrip resonator of the second local oscillator is approximately 19 mm, and the length $l_2$ of the microstrip resonator of the narrow-band band-pass filter is approximately 18 mm.

Figure 10:
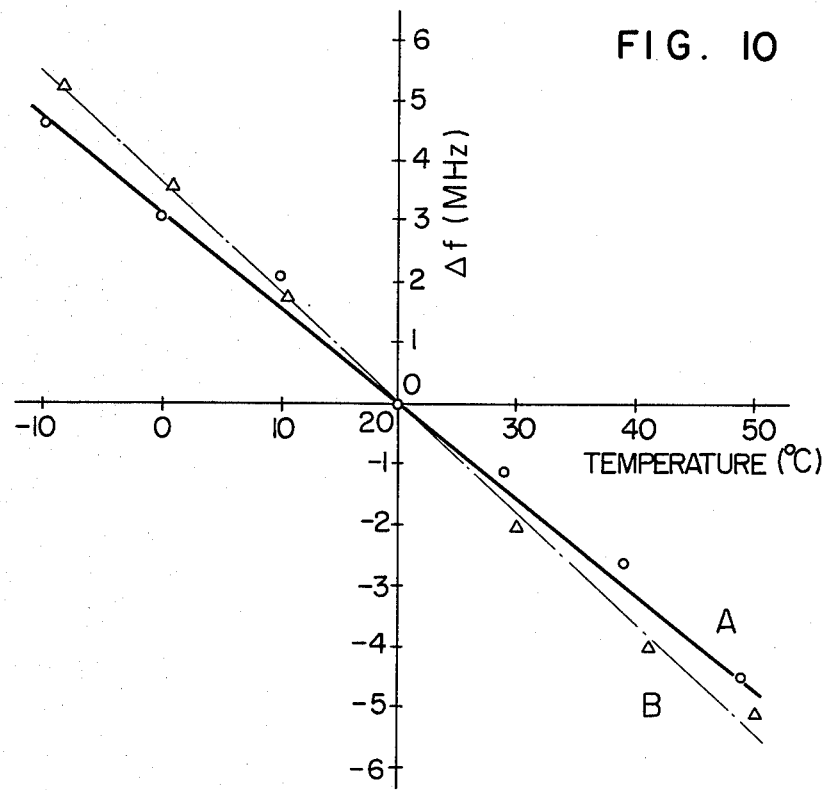
FIG. 10 shows a characteristic diagram of measured frequency-temperature characteristics of the narrow-band band-pass filter and the second local oscillator.

FIG. 10 shows the temperature characteristics of the narrow-band band-pass filter and the second local oscillator. An abscissa represents a surrounding temperature and an ordinate represents a frequency variation. A solid line curve A shows a variation of the center frequency (3,000 MHz) of the pass band of the band-pass filter and a chain line curve B shows a variation of the second local oscillation frequency (3,057 MHz). As seen from FIG. 10, the temperature coefficient of the curve A is approximately −52 ppm/°C. and that of the curve B is approximately −62 ppm/°C. They are substantially equal to each other and are substantially equal to one half of the temperature coefficient of +100 ppm/°C. of the dielectric constant of the substrate and are close to calculated values. A difference between the curve A and the curve B is 10 ppm/°C. and a frequency difference is approximately 0.6 MHz for the temperature change of 20° C. Since the 3 dB band width of the narrow-band band-pass filter is 18–20 MHz and the 1 dB band width thereof is approximately 5 MHz, the variation of the output level of the intermediate frequency signal is negligibly small.

Figure 11:
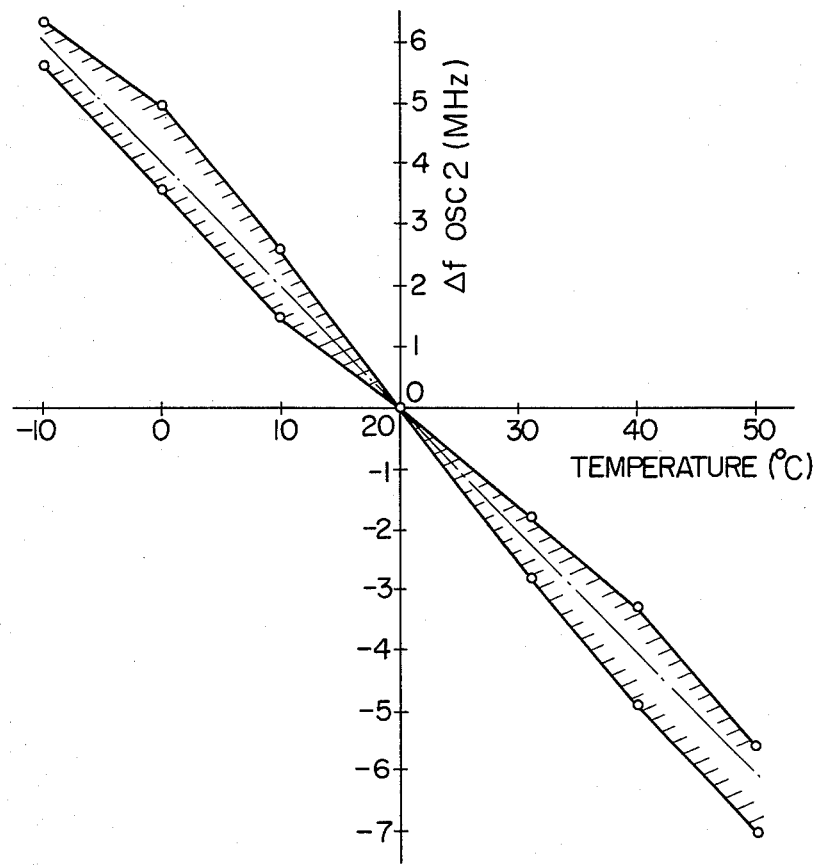
FIG. 11 shows a characteristic diagram of a measured frequency-temperature characteristic of the first local oscillator.

FIG. 11 shows the temperature characteristic of the first local oscillator. An abscissa represents a surrounding temperature and an ordinate represents a variation of the oscillation frequency for the oscillation frequency range of 2,100 MHz–2,950 MHz. Due to a difference between the temperature coefficients of junction capacitance of the varactor diode under different applied voltages and a difference between the oscillation frequencies, the temperature change is not uniform but varies in a definite range as shown. An average temperature coefficient shown by a chain line curve is approximately −67 ppm/°C. which is larger than a temperature coefficient of −50 ppm/°C. of the frequency due to only the dielectric constant. A width for the average value is approximately ±13 ppm/°C. A difference from a temperature coefficient of −62 ppm/°C. of the second local oscillation frequency is 5±13 ppm/°C. and the variation of the intermediate frequency is approximately −0.5 MHz–1.1 MHz. Thus, a good temperature characteristic is obtained. The varactor diode used has the junction capacitance of 4 pF–1 pF for the applied voltage of 0.5 volt–27 volts.

Figure 12:
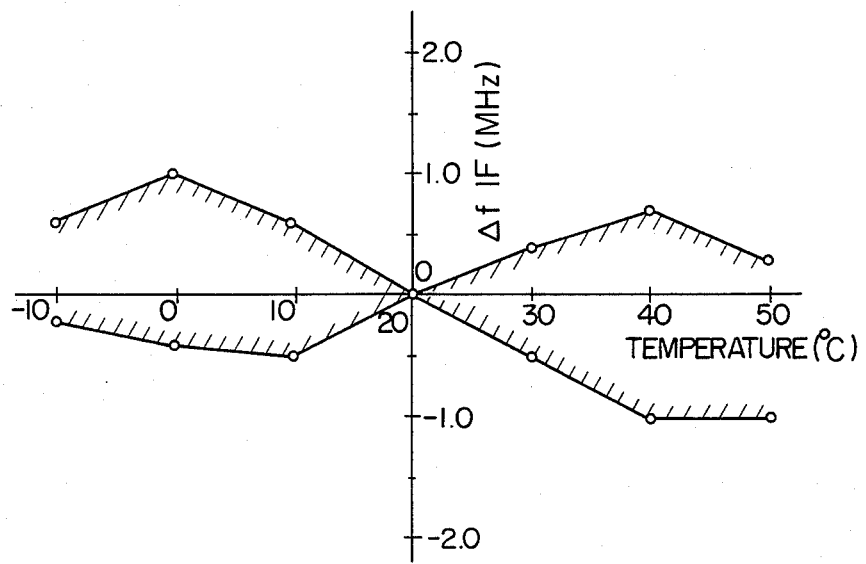
FIG. 12 shows a characteristic diagram of a measured intermediate frequency-temperature characteristic.

FIG. 12 shows the frequency-temperature characteristic of the intermediate frequency signal measured for the RF signal of 50–900 MHz. An abscissa represents a surrounding temperature and an ordinate represents a variation of the intermediate frequency. Considering the variation within 20° C.±20° C., it is +1− −0.4 MHz at 0° C. and −1−+1 MHz at 40° C. Thus, a good temperature characteristic is obtained. With such a degree of frequency variation, the tuner of the television receiver can sufficiently perform the pull-in by AFC. Since a conventional television receiver can pull in within a range of ±2 MHz, the tuner of the present invention can provide a sufficiently practicable temperature characteristic of the tuner without applying special temperature compensation to the narrow-band band-pass filter and the first and second local oscillators. While the temperature characteristic of the frequency has been discussed, it should be noted that a stable temperature characteristic is also attained for the level of the intermediate frequency output signal.

For the measurement described above, average data for four tuners were used. A variation among those data is sufficiently small and the variation of the intermediate frequency is small enough to meet the pull-in range of AFC.

An embodiment of the present invention which uses a PLL circuit to control the oscillation frequency of the first local oscillator is now explained.

Figure 14:
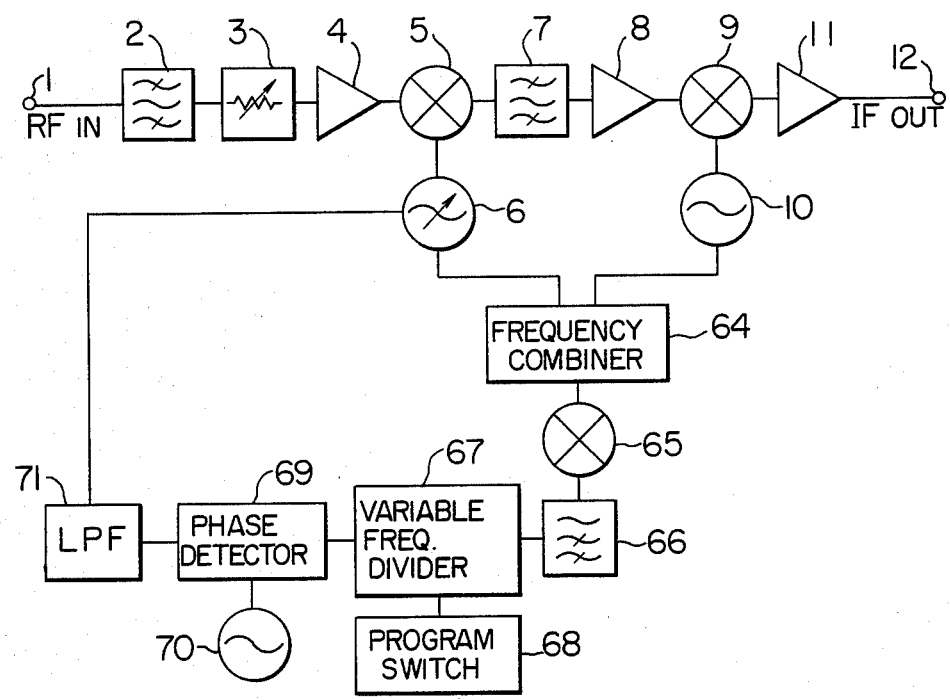
FIG. 14 shows a block diagram of an embodiment in which the first local oscillator is controlled by a PLL circuit.

FIG. 14 shows a block diagram of a circuit for controlling the first local oscillation of the tuner of the present invention by a phase locked loop (PLL) circuit.

Figure 1:
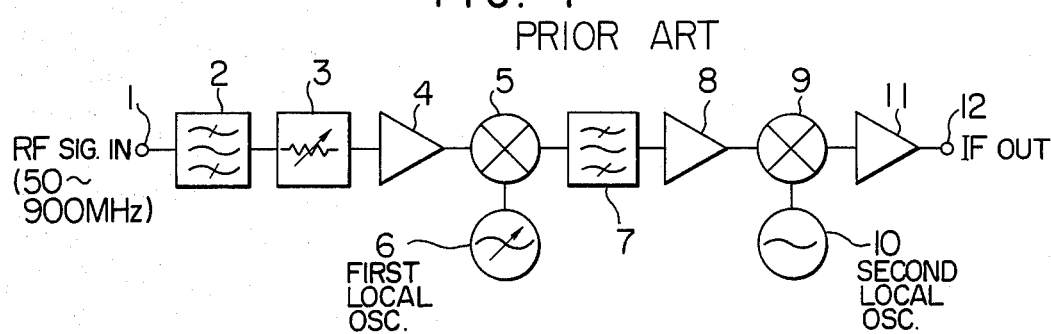
FIG. 1 shows a block diagram of a double-superheterodyne tuner.

The like elements to those shown in FIG. 1 are designated by the like numerals.

Numeral 64 denotes a frequency combiner, numeral 65 denotes a third mixer, numeral 66 denotes a low-pass filter, numeral 67 denotes a variable frequency divider, numeral 68 denotes a program switch, numeral 9 denotes a phase detector, numeral 70 denotes a reference oscillator and numeral 71 denotes a low-pass filter.

By constructing the band-pass filter 7 and the second local oscillator 10 by one-half wavelength microstrip lines on dielectric substrates having substantially equal dielectric constant and substantially equal dielectric constant temperature coefficient, it is possible to attain the substantially equal frequency-temperature characteristic for the band-pass filter and the second local oscillator. Accordingly, the intermediate frequency signal can be taken out at an optimum condition without affected by the frequency variations of the band-pass filter and the second local oscillator as described above because the first local oscillation frequency also has substantially the same variation.

When the first local oscillation frequency is controlled by the PLL circuit, that is, when the frequency $f_{OSC1}$ is controlled by the PLL circuit based on a difference between the first local oscillation frequency $f_{OSC1}$ and the second local oscillation frequency $f_{OSC2}$ such that the difference between $f_{OSC1}$ and $f_{OSC2}$ is equal to $f_{RF}+f_{IF}$, the frequency $f_{IF}$ is stable and the first intermediate frequency signal passes an optimum pass band of the band-pass filter 7. FIG. 14 shows the embodiment of such PLL circuit. The outputs of the first local oscillator 6 and the second local oscillator 10 are supplied to the frequency combiner 64 which comprises a directional coupler, a band-pass filter and a low-pass filter to prevent the oscillation signals and spurious signal components derived from the oscillation signals from coming back to the first and second local oscillators 6 and 10, and the difference between $f_{OSC1}$ and $f_{OSC2}$ is taken out of the third mixer 65 through a low-pass filter 66, and a frequency division ratio is determined by the program switch 68 and the difference frequency is divided by the variable frequency divider 67 in accordance with the selected ratio. The divided signal is compared with the oscillation signal of the reference oscillator 70 by the phase detector 69 which produces an output representing a difference of the phases, which is then integrated by the low-pass filter 71 to produce a D.C. voltage, which in turn is supplied to the first local oscillator 6 to control $f_{OSC1}$. The first local oscillator 6 in the present embodiment need not be constructed by the microstrip line. The signals $f_{OSC1}$ and $f_{OSC2}$ may be frequency-divided before they are supplied to the frequency combiner 64.

Thus, by utilizing the PLL circuit in the present invention, the tuner having further stabilized frequency and stable level of intermediate frequency output signal can be provided and the frequency dependency of the temperature characteristic of the first local oscillator is eliminated.

What is claimed is:

1. A tuner for a television receiver comprising:
   (a) a first mixer for receiving a received RF signal to frequency-convert said RF signal to a first intermediate frequency signal;

(b) a first variable frequency local oscillator for producing an oscillation signal to excite said first mixer;

(c) a band-pass filter for selectively passing said first intermediate frequency signal;

(d) a first intermediate frequency amplifier for amplifying said first intermediate frequency signal;

(e) a second mixer for receiving the first intermediate frequency signal amplified by said first intermediate frequency amplifier to frequency-convert the first intermediate frequency signal to a second intermediate frequency signal;

(f) a second local oscillator for producing an oscillation output to excite said second mixer;

(g) a second intermediate frequency amplifier for selectively amplifying the second intermediate frequency signal output of said second mixer; and (h) said band-pass filter for selectively passing said first intermediate signal and said second local oscillator including microstrip line resonators constructed on dielectric substrates having an equal dielectric constant and an equal dielectric constant temperature coefficient whereby a variation of a resonant frequency due to an ambient temperature change is compensated.

2. A tuner for a television receiver according to claim 1 wherein at least the dielectric substrate of said second local oscillator is a wet multi-layer ceramic substrate constructed by alternately printing a conductive paste primarily consisting of tungsten and a dielectric paste primarily consisting of alumina on front and back surface of an unfired matrix substrate primarily consisting of alumina and having substantially the same composition as said dielectric paste and firing said pastes, and said microstrip line resonator of said second local oscillator includes a conductor formed by thick film printing techniques.

3. A tuner for a television receiver according to claim 2 wherein each of said microstrip line resonators is an open ended microstrip line resonator corresponding to one-half wavelength of a resonant frequency.

4. A tuner for a television receiver according to claim 1 wherein each of said microstrip line resonators is an open ended microstrip line resonator corresponding to one-half wavelength of a resonant frequency.

5. A tuner for a television set according to claim 1 wherein at least the dielectric substrate of said band-pass filter is a sintered alumina-ceramic substrate primarily consisting of alumina, and said microstrip line resonator of said band-pass filter includes a conductor formed by thick film printing techniques.

6. A tuner for a television receiver according to claim 5 wherein each of said microstrip line resonators is an open ended microstrip line resonator corresponding to one-half wavelength of a resonant frequency.

7. A tuner for a television receiver according to claim 1 wherein a center frequency of a bandpass of said band-pass filter is determined substantially by the length of the microstrip line of said band-pass filter, and wherein an oscillation frequency of said second local oscillator is determined substantially by the length of the microstrip line of the second local oscillator.

8. A tuner for a television receiver according to claim 7 wherein said microstrip line resonators of said band-pass filter and said second local oscillator are arranged to respectively determine the center frequency of the bandpass of the band-pass filter and the oscillation frequency of the second local oscillator based upon the lengths of the microstrip lines without the use of discrete capacitors coupled to said microstrip lines.

9. A tuner for a television receiver according to claim 8 wherein a resonance frequency $f_r$ of said microstrip line resonator of said band-pass filter is substantially determined by a relationship of:

$$2\pi f_r \approx \frac{\pi \cdot C_o}{\sqrt{\epsilon} \cdot l_1}$$

where $C_o$ is a light velocity, $\epsilon$ is an effective dielectric constant of said dielectric substrate on which said microstrip line resonator of said band-pass filter is constructed, and $l_1$ is the length of the microstrip line of said band-pass filter, and wherein the oscillation frequency $f_o$ of said microstrip line resonator of said second local oscillator is substantially determined by a relationship of:

$$2\pi f_o \approx \frac{\sqrt{3} \cdot C_o}{\sqrt{\epsilon} \cdot l_2}$$

where $C_o$ is a light velocity, $\epsilon$ is an effective dielectric constant of said dielectric substrate on which said microstrip line resonator of said second local oscillator is constructed, and $l_2$ is the length of the microstrip line of said second local oscillator.

10. A tuner for a television receiver according to claim 8 wherein said first intermediate frequency signal is greater in frequency than said RF signal and wherein said second intermediate frequency signal is smaller in frequency than said RF signal.

11. A tuner for a television receiver according to claim 7 wherein a resonance frequency $f_r$ of said microstrip line resonator of said band-pass filter is substantially determined by a relationship of:

$$2\pi f_r \approx \frac{\pi \cdot C_o}{\sqrt{\epsilon} \cdot l_1}$$

where $C_o$ is a light velocity, $\epsilon$ is an effective dielectric constant of said dielectric substrate on which said microstrip line resonator of said band-pass filter is constructed, and $L_1$ is the length of the microstrip line of said band-pass filter, and wherein the oscillation frequency $f_o$ of said microstrip line resonator of said second local oscillator is substantially determined by a relationship of:

$$2\pi f_o \approx \frac{\sqrt{3} \cdot C_o}{\sqrt{\epsilon} \cdot l_2}$$

where $C_o$ is a light velocity, $\epsilon$ is an effective dielectric constant of said dielectric substrate on which said microstrip line resonator of said second local oscillator is constructed, and $l_2$ is the length of the microstrip line of said second local oscillator.

12. A tuner for a television receiver according to claim 7 wherein said first intermediate frequency signal is greater in frequency than said RF signal and wherein said second intermediate frequency signal is smaller in frequency than said RF signal.

13. A tuner for a television receiver according to claim 1 wherein said first intermediate frequency signal is greater in frequency than said RF signal and wherein said second intermediate frequency signal is smaller in frequency than said RF signal.

14. A tuner for a television receiver comprising:
   (a) a first mixer for receiving a received RF signal to frequency-convert said RF signal to a first intermediate frequency signal;
   (b) a first variable frequency local oscillator for producing an oscillation signal to excite said first mixer;
   (c) a band-pass filter for selectively passing said first intermediate frequency signal;
   (d) a first intermediate frequency amplifier for amplifying said first intermediate frequency signal;
   (e) a second mixer for receiving the first intermediate frequency signal amplified by said first intermediate frequency amplifier to frequency-convert the first intermediate frequency signal to a second intermediate frequency signal;
   (f) a second local oscillator for producing an oscillation output to excite said second mixer;
   (g) a second intermediate frequency amplifier for selectively amplifying the second intermediate frequency signal output of said second mixer; and
   (h) said first local oscillator, said band-pass filter for selectively passing said first intermediate signal and said second local oscillator including microstrip line resonators constructed on dielectric substrates having an equal dielectric constant and an equal dielectric constant temperature coefficient whereby a variation of resonant frequency due to an ambient temperature change is compensated.

15. A tuner for a television receiver according to claim 14 wherein each of the dielectric substrates of at least said first and said second local oscillators, is a wet multi-layer ceramic substrate constructed by alternately printing a conductive paste primarily consisting of tungsten and a dielectric paste primarily consisting of alumina on the front and back surfaces of an unfired matrix substrate primarily consisting of alumina and having substantially the same composition as said dielectric paste and firing said pastes, and each of said first and second local oscillators includes a conductor formed by thick film printing techniques.

16. A tuner for a television receiver according to claim 15 wherein each of said microstrip line resonators of said second local oscillator and said band-pass filter is an open ended microstrip line resonator corresponding to one-half wavelength of a resonant frequency.

17. A tuner for a television receiver according to claim 16 wherein said microstrip line resonator of said first local oscillator is a microstrip line resonator having one end thereof grounded through at least one varactor diode.

18. A tuner for a television set according to claim 14 wherein at least the dielectric substrate of said band-pass filter is a sintered alumina-ceramic substrate primarily consisting of alumina, and said microstrip line resonator of said band-pass filter includes a conductor formed by thick film printing techniques.

19. A tuner for a television receiver according to claim 18 wherein each of said microstrip line resonators of said second local oscillator and said band-pass filter is an open ended microstrip line resonator corresponding to one-half wavelength of a resonant frequency.

20. A tuner for a television receiver according to claim 19 wherein said microstrip line resonator of said first local oscillator is a microstrip line resonator having one end thereof grounded through at least one varactor diode.

21. A tuner for a television receiver according to claim 14 wherein each of said microstrip line resonators of said second local oscillator and said band-pass filter is an open ended microstrip line resonator corresponding to one-half wavelength of a resonant frequency.

22. A tuner for a television receiver according to claim 21 wherein said microstrip line resonator of said first local oscillator is a microstrip line resonator having one end thereof grounded through at least one varactor diode.

23. A tuner for a television receiver according to claim 14 wherein a center frequency of a bandpass of said band-pass filter is determined substantially by the length of the microstrip line of said band-pass filter, and wherein an oscillation frequency of said second local oscillator is determined substantially by the length of the microstrip line of the second local oscillator.

24. A tuner for a television receiver according to claim 23 wherein a resonance frequency $f_r$ of said microstrip line resonator of said band-pass filter is substantially determined by a relationship:

$$2\pi f_r \approx \frac{\pi \cdot C_o}{\sqrt{\epsilon} \cdot l_1}$$

where $C_o$ is a light velocity, $\epsilon$ is an effective dielectric constant of said dielectric substrate on which said microstrip line resonator of said band-pass filter is constructed, and $l_1$ is the length of the microstrip line of said band-pass filter, and wherein the oscillation frequency $f_o$ of said microstrip line resonator of said second local oscillator is substantially determined by a relationship of:

$$2\pi f_o \approx \frac{\sqrt{3} \cdot C_o}{\sqrt{\epsilon} \cdot l_2}$$

where $C_o$ is a light velocity, $\epsilon$ is an effective dielectric constant of said dielectric substrate on which said microstrip line resonator of said second local oscillator is constructed, and $l_2$ is the length of the microstrip line of said second local oscillator.

25. A tuner for a television receiver according to claim 23 wherein said first intermediate frequency signal is greater in frequency than said RF signal and wherein said second intermediate frequency signal is smaller in frequency than said RF signal.

26. A tuner for a television receiver according to claim 23 wherein said microstrip line resonators of said band-pass filter and said second local oscillator are arranged to respectively determine the center frequency of the bandpass of the band-pass filter and the oscillation frequency of the second local oscillator based upon the lengths of the microstrip lines without the use of discrete capacitors coupled to said microstrip lines.

27. A tuner for a television receiver according to claim 26 wherein said first intermediate frequency signal is greater in frequency than said RF signal and wherein said second inermediate frequency signal is smaller in frequency than said RF signal.

28. A tuner for a television receiver according to claim 26 wherein a resonance frequency $f_r$ of said microstrip line resonator of said band-pass filter is substantially determined by a relationship:

$$2\pi f_r \approx \frac{\pi \cdot C_o}{\sqrt{\epsilon} \cdot l_1}$$

where $C_o$ is a light velocity, $\epsilon$ is an effective dielectric constant of said dielectric substrate on which said microstrip line resonator of said band-pass filter is constructed, and $l_1$ is the length of the microstrip line of said band-pass filter, and wherein the oscillation frequency $f_o$ of said microstrip line resonator of said second local oscillator is substantially determined by a relationship of:

$$2\pi f_o \approx \frac{\sqrt{3} \cdot C_o}{\sqrt{\epsilon} \cdot l_2}$$

where $C_o$ is a light velocity, $\epsilon$ is an effective dielectric constant of said dielectric substrate on which siad microstrip line resonator of said second local oscillator is constructed, and $l_2$ is the length of the microstrip line of said second local oscillator.

29. A tuner for a television receiver according to claim 14 wherein said first intermediate frequency signal is greater in frequency than said RF signal and wherein said second intermediate frequency signal is smaller in frequency than said RF signal.

30. A tuner for a television receiver comprising:
(a) a first mixer for receiving a received RF signal to frequency-convert said RF signal to a first intermediate frequency signal;
(b) a first variable frequency local oscillator for producing an oscillation signal to excite said first mixer;
(c) a band-pass filter for selectively passing said first intermediate frequency signal;
(d) a first intermediate frequency amplifier for amplifying said first intermediate frequency signal;
(e) a second mixer for receiving the first intermediate frequency signal amplified by said first intermediate frequency amplifier to frequency-convert the first intermediate frequency signal to a second intermediate frequency signal;
(f) a second local oscillator for producing an oscillation output to excite said second mixer;
(g) a second intermediate frequency amplifier for selectively amplifying the second intermediate frequency signal output of said second mixer;
(h) said band-pass filter for selectively passing said first intermediate signal and said second local oscillator including microstrip line resonators constructed on dielectric substrates having an equal dielectric constant and an equal dielectric constant temperature coefficient; and
(i) a phase locked loop circuit for combining the outputs of said first and second local oscillators, comparing the combined output with a reference signal and controlling the oscillation frequency of said first local oscillator in accordance with the comparison result such that a frequency difference between the oscillation outputs of said first and second local oscillators is kept constant.

31. A tuner for a television receiver according to claim 30 wherein the frequency difference between the oscillation signals of said first and second local oscillators is equal to a sum of the received RF signal frequency and the intermediate frequency signal frequency.

32. A tuner for a television receiver according to claim 30 wherein a center frequency of a bandpass of said band-pass filter is determined substantially by the length of the microstrip line of said band-pass filter, and wherein an oscillation frequency of said second local oscillator is determined substantially by the length of the microstrip line of the second local oscillator.

33. A tuner for a television receiver according to claim 32 wherein said microstrip line resonators of said band-pass filter and said second local oscillator are arranged to respectively determine the center frequency of the bandpass of the band-pass filter and the oscillation frequency of the second local oscillator based upon the lengths of the microstrip lines without the use of discrete capacitors coupled to said microstrip lines.

34. A tuner for a television receiver according to claim 33 wherein a resonance frequency $f_r$ of said microstrip line resonator of said band-pass filter is substantially determined by a relationship of:

$$2\pi f_r \approx \frac{\pi \cdot C_o}{\sqrt{\epsilon} \cdot l_1}$$

where $C_o$ is a light velocity, $\epsilon$ is an effective dielectric constant of said dielectric substrate on which said microstrip line resonator of said band-pass filter is constructed, and $l_1$ is the length of the microstrip line of said band-pass filter, and wherein the oscillation frequency $f_o$ of said microstrip line resonator of said second local oscillator is substantially determined by a relationship of:

$$2\pi f_o \approx \frac{\sqrt{3} \cdot C_o}{\sqrt{\epsilon} \cdot l_2}$$

where $C_o$ is a light velocity, $\epsilon$ is an effective dielectric constant of said dielectric substrate on which said microstrip line resonator of said second local oscillator is constructed, and $l_2$ is the length of the microstrip line of said second local oscillator.

35. A tuner for a television receiver according claim 33 wherein said first intermediate frequency signal is greater in frequency than said RF signal and wherein said second intermediate frequency signal is smaller in frequency than said RF signal.

36. A tuner for a television receiver according to claim 32 wherein a resonance frequency $f_r$ of said microstrip line resonator of said band-pass filter is substantially determined by a relationship of:

$$2\pi f_r \approx \frac{\pi \cdot C_o}{\sqrt{\epsilon} \cdot l_1}$$

where $C_o$ is a light velocity, $\epsilon$ is an effective dielectric constant of said dielectric substrate on which said microstrip line resonator of said band-pass filter is constructed, and $l_1$ is the length of the microstrip line of said band-pass filter, and wherein the oscillation frequency $f_o$ of said microstrip line resonator of said second local oscillator is substantially determined by a relationship of:

$$2\pi f_o \approx \frac{\sqrt{3} \cdot C_o}{\sqrt{\epsilon} \cdot l_2}$$

where $C_o$ is a light velocity, $\epsilon$ is an effective dielectric constant of said dielectric substrate on which said microstrip line resonator of said second local oscillator is constructed, and $l_2$ is the length of the microstrip line of said second local oscillator.

37. A tuner for a television receiver according to claim 32 wherein said first intermediate frequency signal is greater in frequency than said RF signal and wherein said second intermediate frequency signal is smaller in frequency than said RF signal.

38. A tuner for a television receiver according to claim 30 wherein said first intermediate frequency signal is greater in frequency than said RF signal and wherein said second intermediate frequency signal is smaller in frequency than said RF signal.

* * * * *